United States Patent
Xie et al.

(10) Patent No.: US 10,366,930 B1
(45) Date of Patent: Jul. 30, 2019

(54) SELF-ALIGNED GATE CUT ISOLATION

(71) Applicant: GLOBALFOUNDRIES Inc., Grand Cayman (KY)

(72) Inventors: Ruilong Xie, Niskayuna, NY (US); Chanro Park, Clifton Park, NY (US); Min Gyu Sung, Latham, NY (US); Kangguo Cheng, Schenectady, NY (US); Guillaume Bouche, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/005,064

(22) Filed: Jun. 11, 2018

(51) Int. Cl.
*H01L 21/8238* (2006.01)
*H01L 29/06* (2006.01)
*H01L 27/092* (2006.01)
*H01L 29/66* (2006.01)

(52) U.S. Cl.
CPC ........... *H01L 21/823821* (2013.01); *H01L 21/823878* (2013.01); *H01L 27/0924* (2013.01); *H01L 29/0649* (2013.01); *H01L 29/66545* (2013.01)

(58) Field of Classification Search
CPC ..... H01L 21/823821; H01L 21/823878; H01L 27/0924; H01L 29/0649; H01L 29/66545
See application file for complete search history.

(56) References Cited

U.S. PATENT DOCUMENTS

| | | | |
|---|---|---|---|
| 2014/0353767 A1* | 12/2014 | Liu | ............. H01L 21/845 257/401 |
| 2016/0233298 A1 | 8/2016 | Webb et al. | |

* cited by examiner

*Primary Examiner* — Feifei Yeung Lopez
(74) *Attorney, Agent, or Firm* — Amerson Law Firm, PLLC

(57) ABSTRACT

A method includes forming a plurality of fins above a substrate. A first placeholder gate electrode is formed above the plurality of fins. The first placeholder gate electrode includes a placeholder material. A first sacrificial gate cut structure of a sacrificial material different than the placeholder material embedded in the first placeholder gate electrode is formed. A portion of the first placeholder gate electrode positioned above the first sacrificial gate cut structure is removed, exposing the first sacrificial gate cut structure. The first sacrificial gate cut structure is removed to define a gate cut cavity extending vertically through the first placeholder gate electrode. A dielectric material is formed in the gate cut cavity to define a gate cut structure. The first placeholder gate electrode is removed to define a first gate cavity segmented by the gate cut structure. A first replacement gate structure is formed in the first gate cavity.

20 Claims, 13 Drawing Sheets

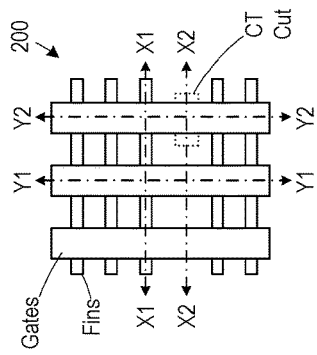
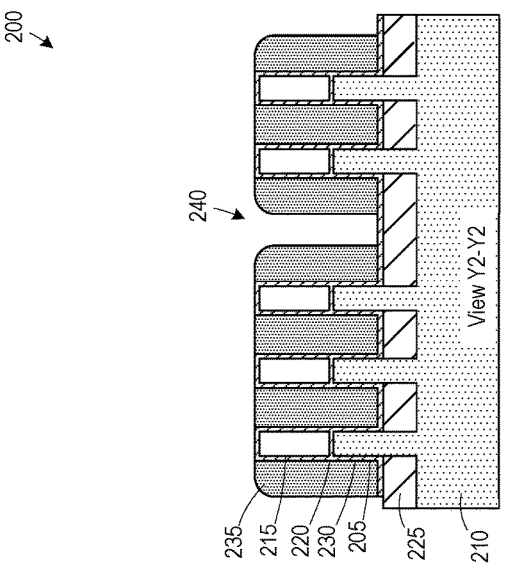
Figure 2B
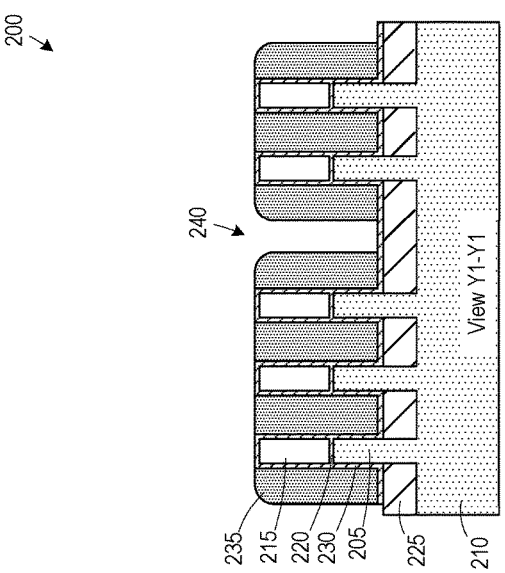

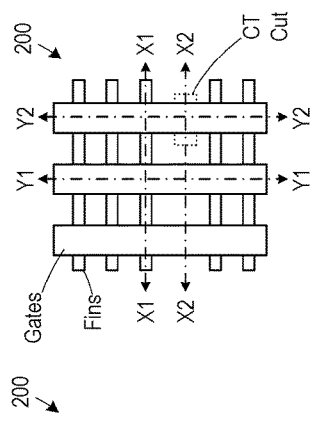
Figure 2C
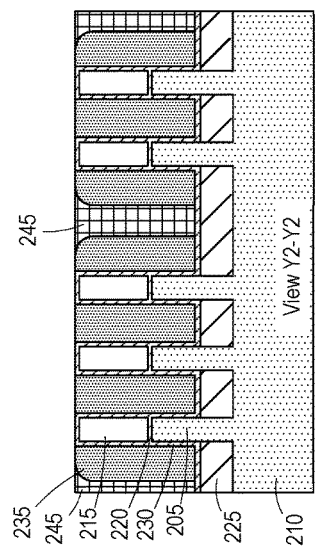
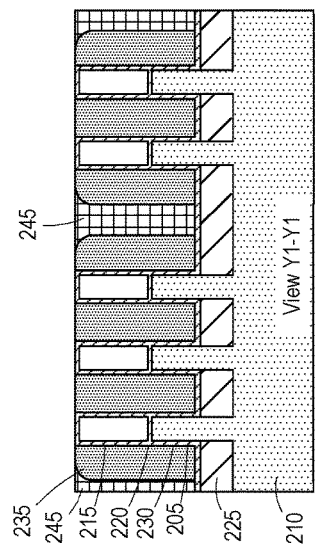

SELF-ALIGNED GATE CUT ISOLATION

BACKGROUND OF THE INVENTION

1. Field of the Invention

The present disclosure generally relates to the fabrication of integrated circuits, and, more particularly, to various methods of performing self-aligned gate cut processes for FinFET semiconductor devices and the resulting devices.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

FIG. 1 is a perspective view of an illustrative prior art integrated circuit product 100 that is formed above a semiconductor substrate 105. In this example, the product 100 includes five illustrative fins 110, 115, a shared gate structure 120, a sidewall spacer 125 and a gate cap 130. The product 100 implements two different FinFET transistor devices (N-type and P-type) with a shared gate structure. The gate structure 120 is typically comprised of a layer of insulating material (not separately shown), e.g., a layer of high-k insulating material or silicon dioxide, and one or more conductive material layers (e.g., metal and/or polysilicon) that serve as the gate electrode for the transistors on the product 100. The fins 110, 115 have a three-dimensional configuration. The portions of the fins 110, 115 covered by the gate structure 120 define the channel regions of the FinFET transistor devices on the product 100. An isolation structure 135 is formed between the fins 110, 115. The fins 110 are associated with a transistor device of a first type (e.g., N-type), and the fins 115 are associated with a transistor device of a complementary type (e.g., P-type). The gate structure 120 is shared by the N-type and P-type transistors, a common configuration for memory products, such as static random access memory (SRAM) cells.

Typically, fins are formed in a regular array. An array of placeholder gate structures is formed above the fins. Subsequently, a gate cut or "CT cut" process is performed to cut the placeholder gate structures in the cross direction, for example, between the fins 110, 115 for a device without a shared gate electrode. A dielectric material is formed in the gate cut recess. Subsequently, the placeholder gate structures are removed and replacement gate structures (e.g., high-k gate dielectric and metal) are formed. In aggressively scaled devices, it is difficult to create a gate cut opening between the fins 110, 115 due to the small space therebetween. In some instances, the gate cut etch process may not completely etch through the gate structure, causing a gate-to-gate short. In other instances, the CD of the gate cut recess and subsequent gate cut structure may be such that it is difficult to form work function materials (WFM) and metal conductive fill materials without forming voids adjacent the gate cut structure.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods for performing a self-aligned gate cut process for FinFET semiconductor devices and the resulting devices. One illustrative method includes, among other things, forming a plurality of fins above a substrate. A first placeholder gate electrode is formed above the plurality of fins. The first placeholder gate electrode includes a placeholder material. A first sacrificial gate cut structure of a sacrificial material different than the placeholder material embedded in the first placeholder gate electrode is formed. A portion of the first placeholder gate electrode is removed to expose the first sacrificial gate cut structure. The first sacrificial gate cut structure is removed to define a gate cut cavity extending vertically through the first placeholder gate electrode. A dielectric material is formed in the gate cut cavity to define a gate cut structure. The first placeholder gate electrode is removed to define a first gate cavity segmented by the gate cut structure. A first replacement gate structure is formed in the first gate cavity.

Another illustrative method includes, among other things, forming a semiconductor device comprising a plurality of fins formed above a substrate with a first hard mask layer positioned on an upper surface of the plurality of fins and an isolation structure positioned between the plurality of fins. A first spacer is formed adjacent a first subset of the plurality of fins and a second spacer is formed adjacent a second subset of the plurality of fins. The first and second spacers are formed of a placeholder material, and the first and second spacers cover sidewalls of the first hard mask layer. A sacrificial layer of a sacrificial material different than the placeholder material is formed in a first cavity defined between the first and second spacers. The first hard mask layer is removed to define a second cavity. A placeholder layer of the placeholder material is formed in the second cavity and above the first and second spacers. The first and second spacers, the placeholder layer and the sacrificial layer are patterned to define a first placeholder gate electrode from the first and second spacers and the placeholder layer, and to define a first sacrificial gate cut structure from the sacrificial layer. A third cavity is formed in the placeholder layer to expose the first sacrificial gate cut structure. The first sacrificial gate cut structure is removed to define a gate cut cavity extending vertically through the first placeholder gate electrode to the isolation structure. A dielectric material is formed in the gate cut cavity to define a gate cut structure. The first placeholder gate electrode is removed to define a first gate cavity segmented by the gate cut structure. A first replacement gate structure is formed in the first gate cavity.

Yet another illustrative method includes, among other things, forming a plurality of fins above a substrate. A plurality of placeholder gate electrodes is formed above the plurality of fins. The placeholder gate electrodes include a placeholder gate material. A plurality of sacrificial gate cut structures of a sacrificial material different than the placeholder material is formed embedded in the plurality of placeholder gate electrodes. Portions of the placeholder gate electrodes are removed to expose selected sacrificial gate cut structures. The selected sacrificial gate cut structures are removed to define gate cut cavities extending vertically through the associated placeholder gate electrodes. A dielectric material is formed in the gate cut cavities to define gate cut structures. The placeholder gate electrodes and remaining sacrificial gate cut structures are removed using a concurrent etch process to define gate cavities. A subset of the gate cavities are segmented by the gate cut structures. Replacement gate structures are formed in the gate cavities.

BRIEF DESCRIPTION OF THE DRAWINGS

The disclosure may be understood by reference to the following description taken in conjunction with the accompanying drawings, in which like reference numerals identify like elements, and in which:

FIGS. 2A-2L depict one illustrative method disclosed for performing a self-aligned gate cut process for FinFET semiconductor devices and the resulting devices.

Figure 1:
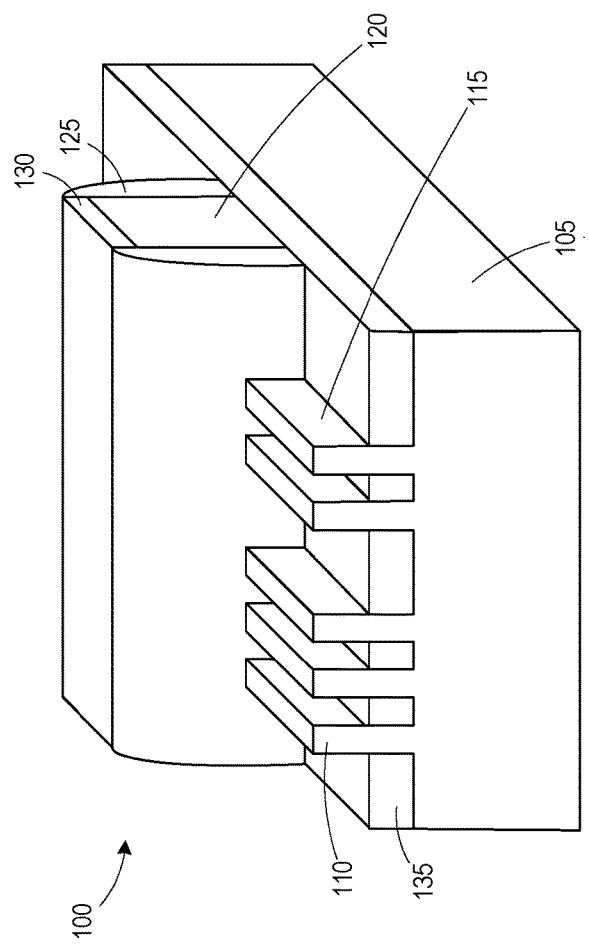
FIG. 1 is a perspective view of one illustrative embodiment of a prior art semiconductor product.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of performing a self-aligned gate cut process for FinFET semiconductor devices and the resulting devices. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. As will be appreciated by those skilled in the art after a complete reading of the present application, the inventions disclosed herein may be employed in forming integrated circuit products using a variety of so-called 3D devices, such as FinFETs.

The inventions disclosed herein should not be considered to be limited to the illustrative examples depicted and described herein. With reference to the attached figures, various illustrative embodiments of the methods and devices disclosed herein will now be described in more detail.

FIGS. 2A-2L depict one illustrative method disclosed for performing a self-aligned gate cut process for FinFET semiconductor devices and the resulting devices. The illustrative product 200 includes a plurality of fins 205 formed in a semiconductor substrate 210.

The substrate 210 may have a variety of configurations, such as the depicted bulk silicon configuration. The substrate 210 may also have a silicon-on-insulator (SOI) configuration that includes a bulk silicon layer, a buried insulation layer and an active layer, wherein semiconductor devices are formed in and above the active layer. The substrate 210 may be formed of silicon or silicon germanium or it may be made of materials other than silicon, such as germanium. Thus, the terms "substrate" or "semiconductor substrate" should be understood to cover all semiconducting materials and all forms of such materials. The substrate 210 may have different layers.

Figure 2A:
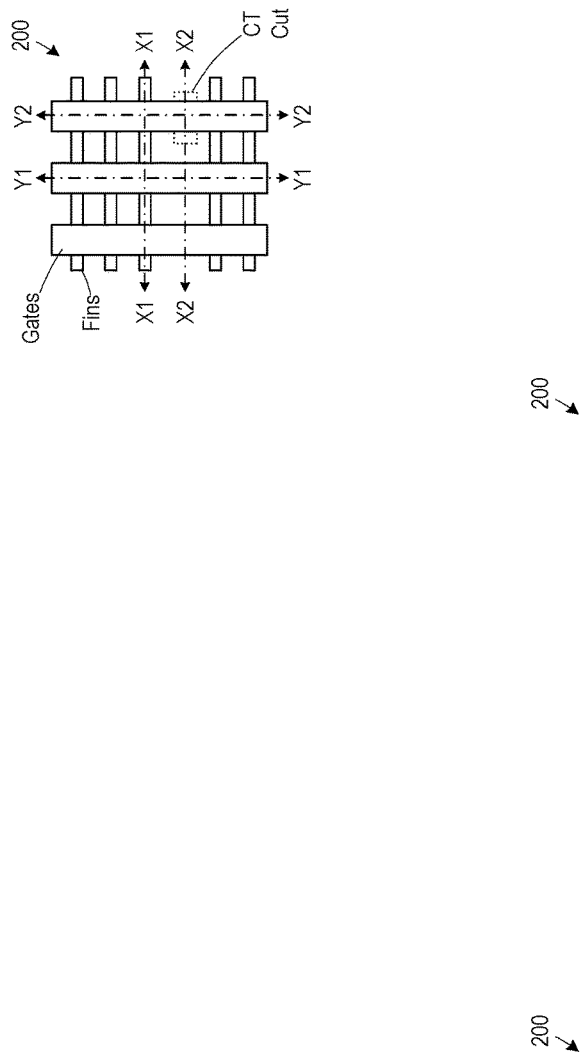
Figure 2A:
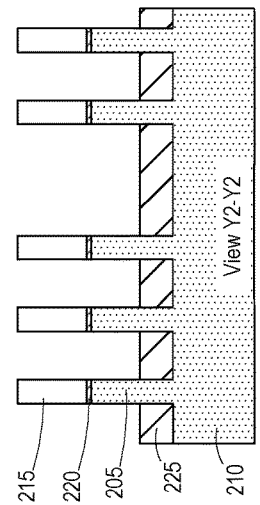
Figure 2A:
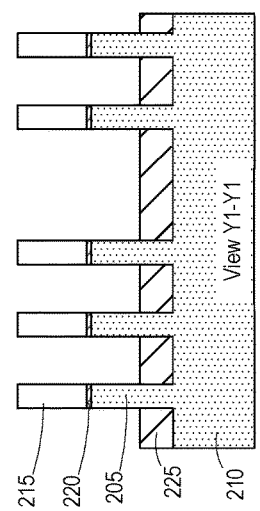

FIG. 2A depicts the product 200 at a point in fabrication wherein several process operations have been performed. First, the plurality of fins 205 were formed using a mask including a first hard mask layer 215 (e.g., silicon nitride). In some embodiments, a second hard mask layer 220 (e.g., silicon dioxide) may be formed beneath the first hard mask layer 215. In general, the fins 205 define an active region for forming devices, such as FinFET transistors. An isolation structure (e.g., STI) 225 was formed by depositing a dielectric layer (e.g., silicon dioxide) between the fins and recessing the dielectric layer.

FIGS. 2A-2L also include a simplistic plan view of the product 200 (in the upper right corner of each sheet) that depicts the location where various cross-sectional views depicted in the following drawings will be taken. More specifically, the cross-sectional views "X1-X1" (through fin) and "X2-X2" (in gate cut region) are taken along the long axis of the fin structures, and the cross-sectional views "Y1-Y1" (no gate cut) and "Y2-Y2" (gate cut) are taken along the long axis of gate structures. Not all views are shown on each Figure.

FIG. 2B illustrates the product 200 after several processes were performed. A liner layer 230 (e.g., silicon dioxide) was formed above the fins 205 and the hard mask layer 215. Since the liner layer 230 and the isolation structure 225 are the same material in the illustrated embodiment, the horizontal portions of the liner layer 230 deposited on the isolation structure 225 are illustrated as having merged. A conformal deposition process was performed to form a spacer layer from a placeholder material (e.g., amorphous silicon (a-Si)), and an anisotropic etch process was performed to define spacers 235 from the spacer layer. Due to the pitch of the fins 205, the spacers merge in the regions between adjacent fins 205. A gate cut cavity 240 is defined between the spacers 235 in a region between the two sets of fins 205. Since the gate cut cavity 240 is defined based on the distance between adjacent spacers 235, the process is self-aligned, and the width of the gate cut cavity 240 may be controlled by varying the thickness of the spacer layer, and, hence, the resulting widths of the spacers 235.

FIG. 2C illustrates the product 200 after a plurality of processes was performed. A deposition process was performed to form a sacrificial layer 245 (e.g., SiGe) in the gate cut cavity 240. A recess etch or planarization process was performed to remove portions of the sacrificial layer 245 outside the gate cut cavity 240.

Figure 2D:
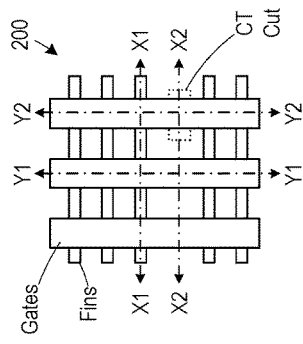
Figure 2D:
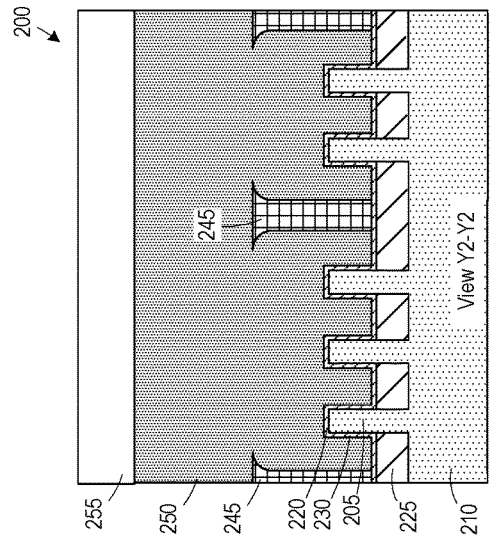
Figure 2D:
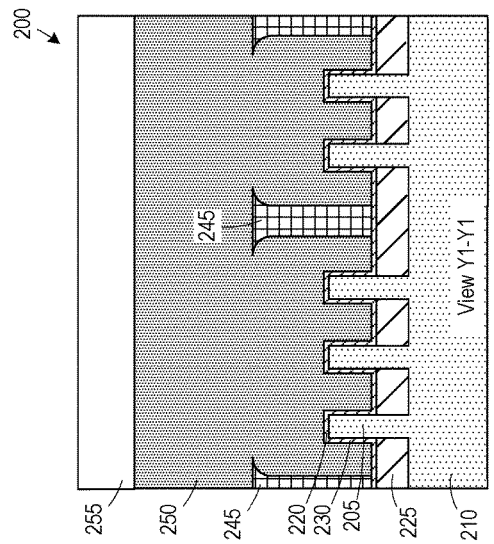

FIG. 2D illustrates the product 200 after several processes were performed. One or more etch processes were performed to remove the first hard mask layer 215. A deposition process was performed to deposit a placeholder layer 250 having the same material as the spacers 235 (e.g., a-Si), thereby merging with the spacers 235 and filling the cavity created by removing the first hard mask layer 215. Another deposition process was performed to form a hard mask layer 255 (e.g., silicon nitride) above the layer 250.

Figure 2E:
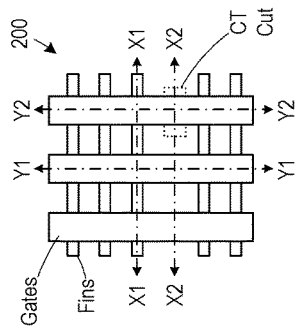
Figure 2E:
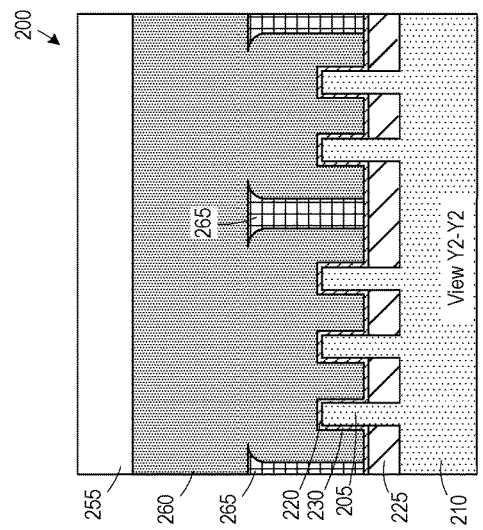
Figure 2E:
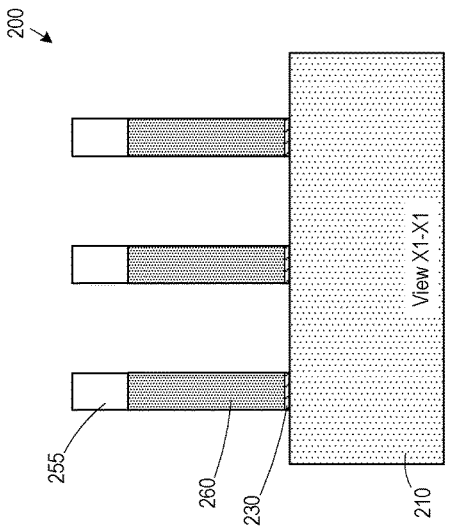
Figure 2E:
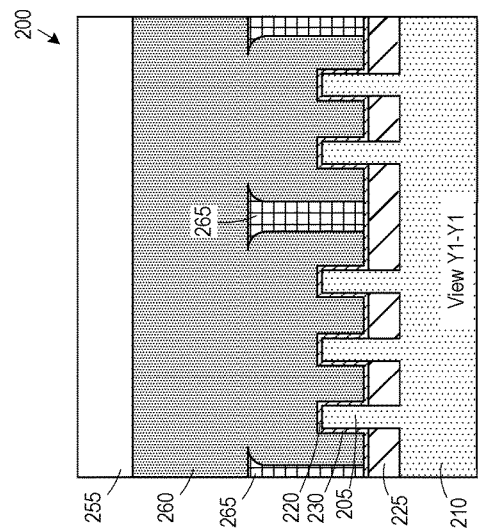

FIG. 2E illustrates the product 200 after several processes were performed. A patterning process was performed to pattern the hard mask layer 255 corresponding to the pattern of gate electrodes to be formed. An anisotropic etch process was performed using the patterned hard mask layer 255 to etch the placeholder layer 250 to define placeholder gate electrodes 260. The etch process also patterns the sacrificial layer 245 to define sacrificial gate cut structures 265 having the same width as the placeholder gate electrodes 260. An etch process was performed to remove exposed portions of the liner layer 230.

Figure 2F:
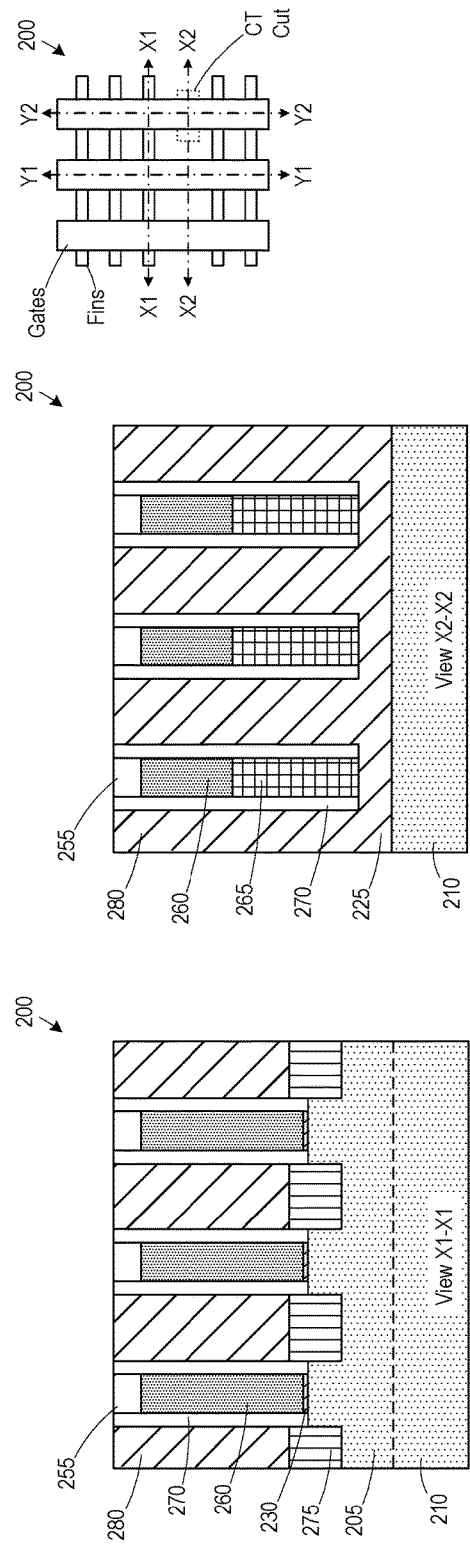
Figure 2F:
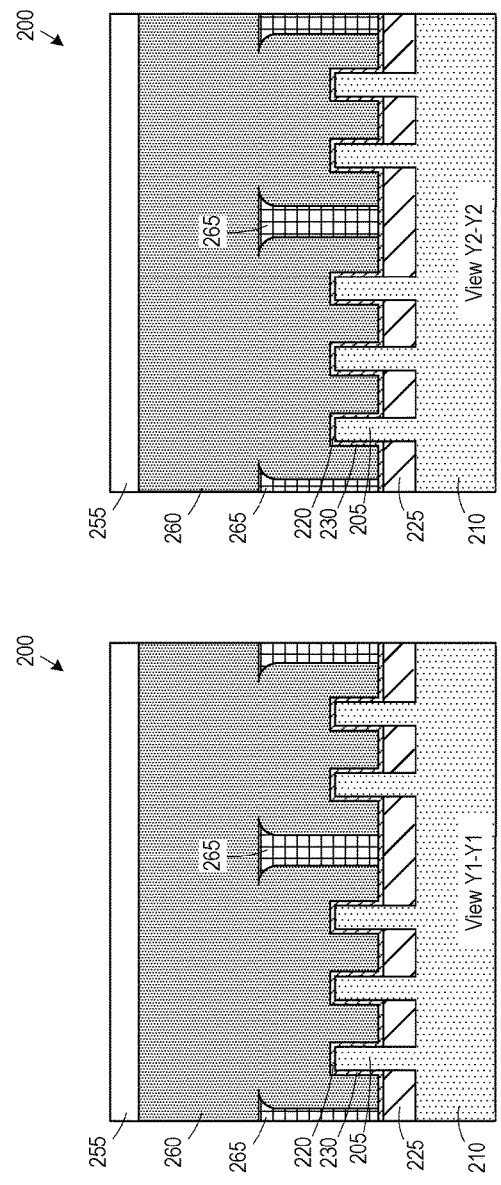

FIG. 2F illustrates the product 200 after several processes were performed. Spacers 270 (e.g., silicon nitride) were formed adjacent the placeholder gate electrodes 260 by depositing a spacer layer and performing an anisotropic etch process. The exposed portions of the fins 205 were recessed and an epitaxial growth process was performed to define epitaxial material regions 275 for the source/drain regions of the resulting transistor devices. A dielectric layer 280 (e.g., silicon dioxide, a low-k dielectric material, or an ultra-low-k dielectric material) was formed between the placeholder gate electrodes 260 and planarized to expose the hard mask layer 255. An amount of overpolish is provided, which reduces a thickness of the hard mask layer 260 and a height of the spacers 270.

Figure 2G:
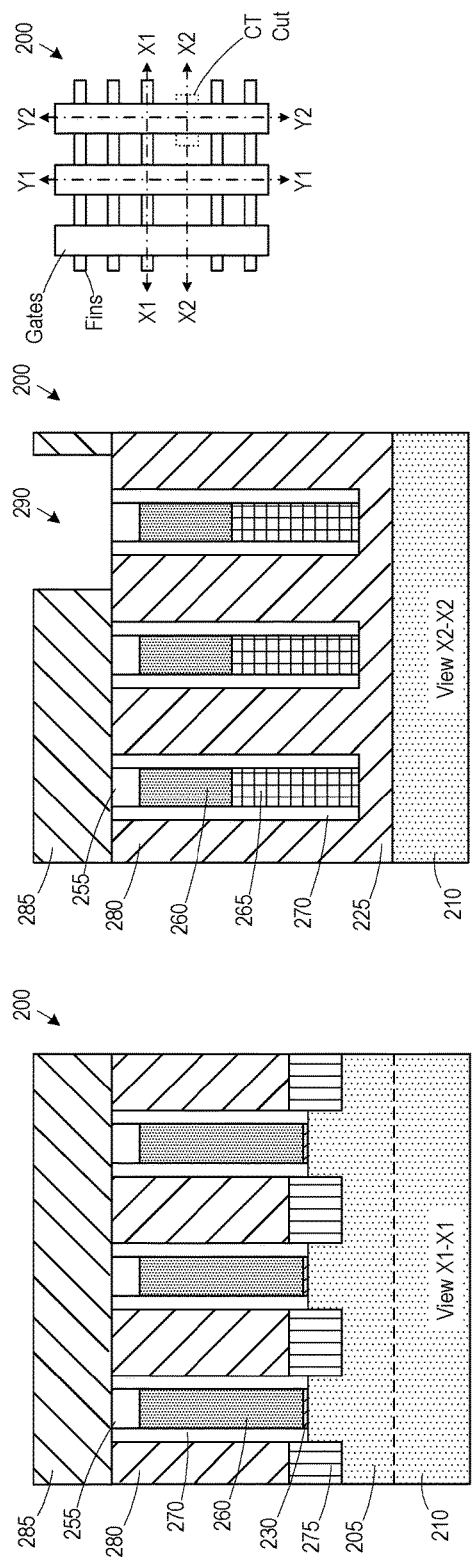
Figure 2G:
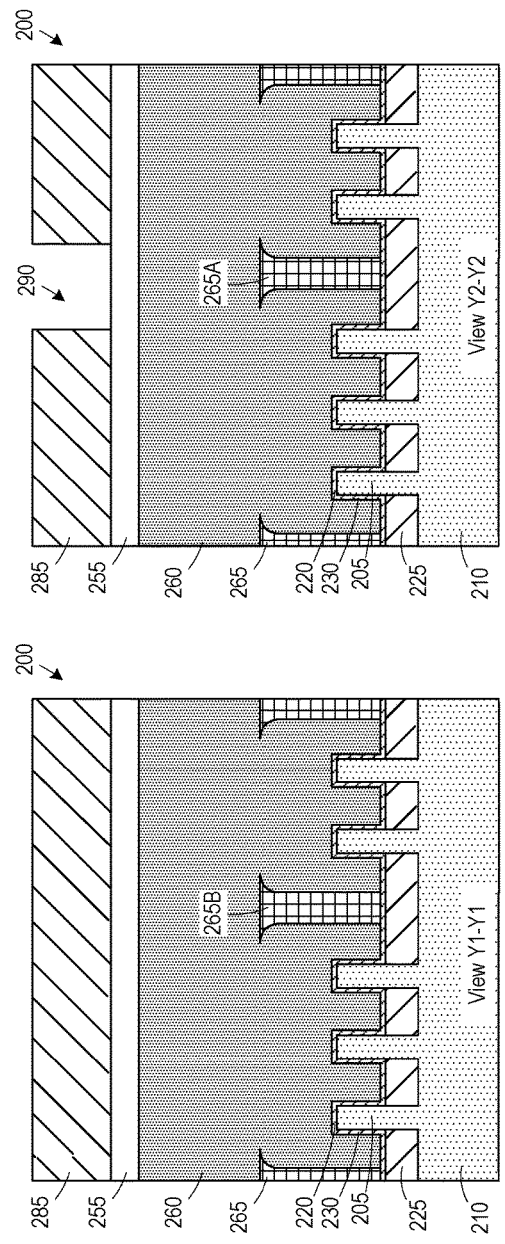

FIG. 2G illustrates the product 200 after several processes were performed to deposit and pattern an organic patterning layer 285 (OPL) to define a CT cut opening 290 above the sacrificial gate cut structure 265A in the CT cut region (see plan view). The sacrificial gate cut structures 265B not in the CT cut region remains covered by the OPL 285.

Figure 2H:
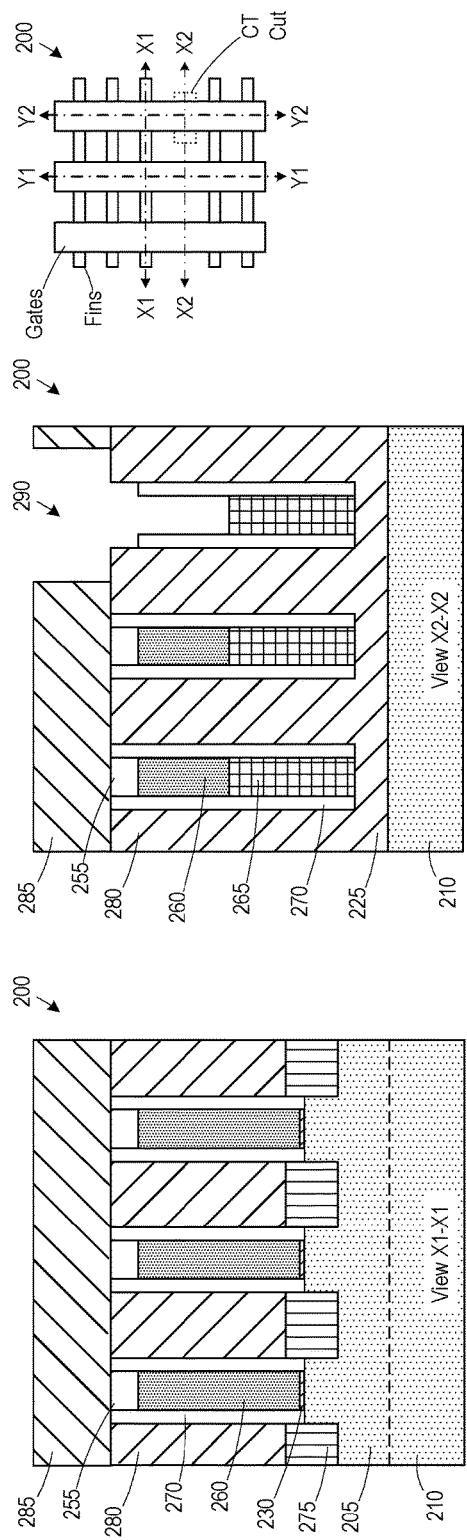
Figure 2H:
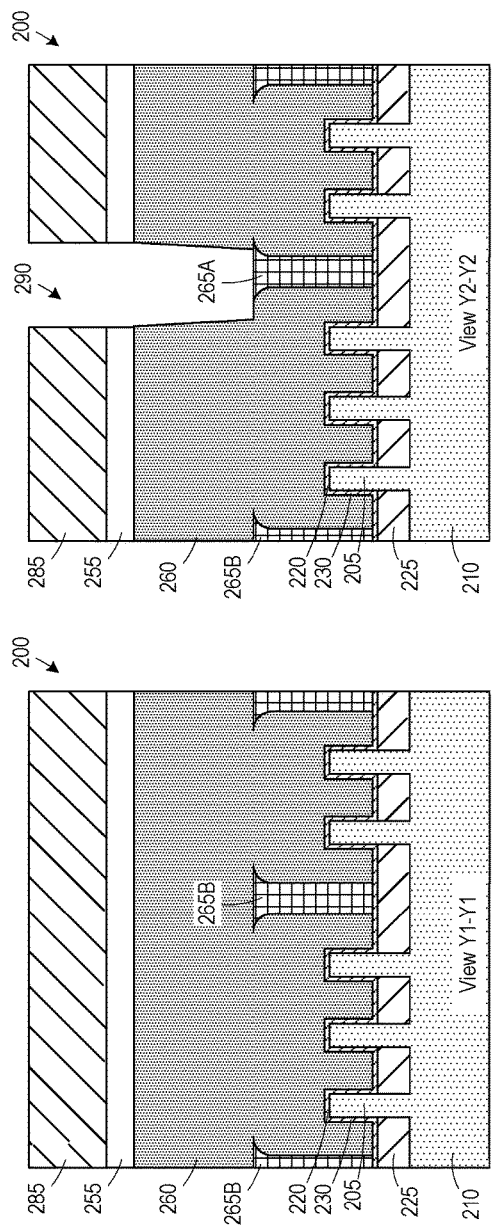

FIG. 2H illustrates the product 200 after one or more etch processes were performed to remove the portions of the hard mask layer 255 and the placeholder gate electrode 260 exposed by the CT cut opening 290 to expose the underlying sacrificial gate cut structure 265A. Note that a relatively large CD and relaxed overlay may be applied when forming the CT cut opening 290, as the process is somewhat self-aligned, and not all of the sacrificial gate cut structure 265A need be exposed.

Figure 2I:
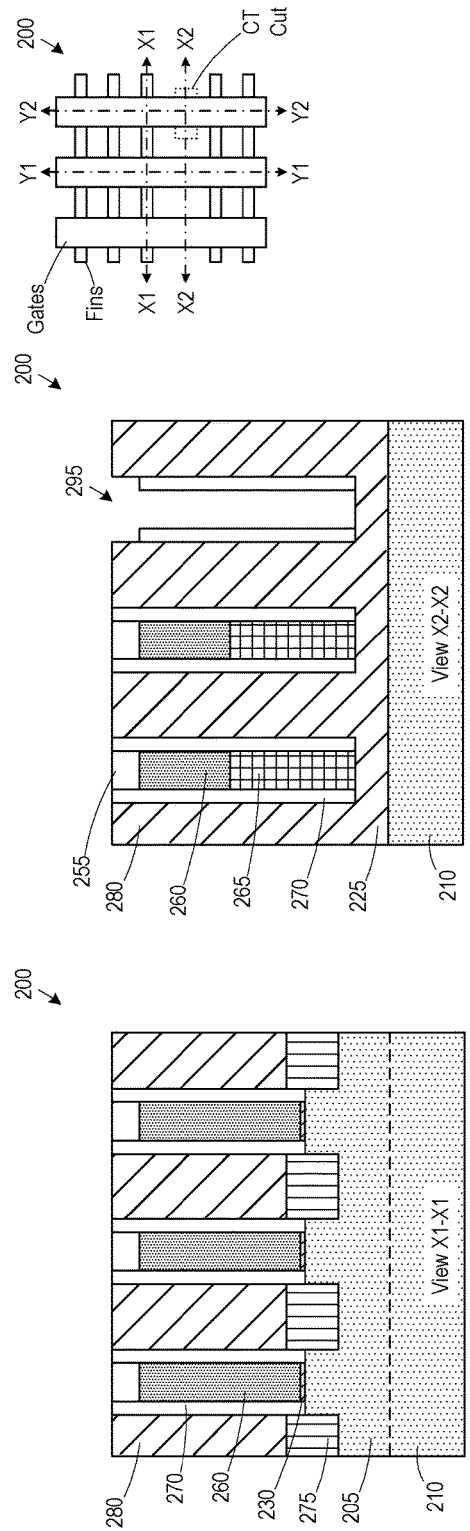
Figure 2I:
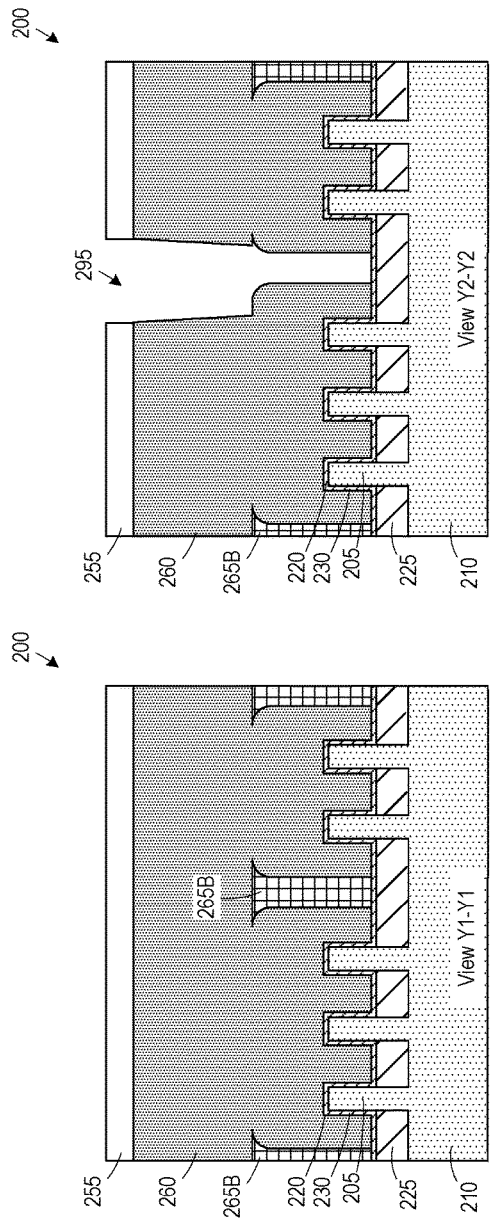

FIG. 2I illustrates the product 200 after a strip process was performed to remove the OPL 285 and a selective etch process was performed to remove the sacrificial gate cut structure 265A, thereby defining a gate cut cavity 295 extending through the placeholder gate electrode 260 to the isolation structure 225.

Figure 2J:
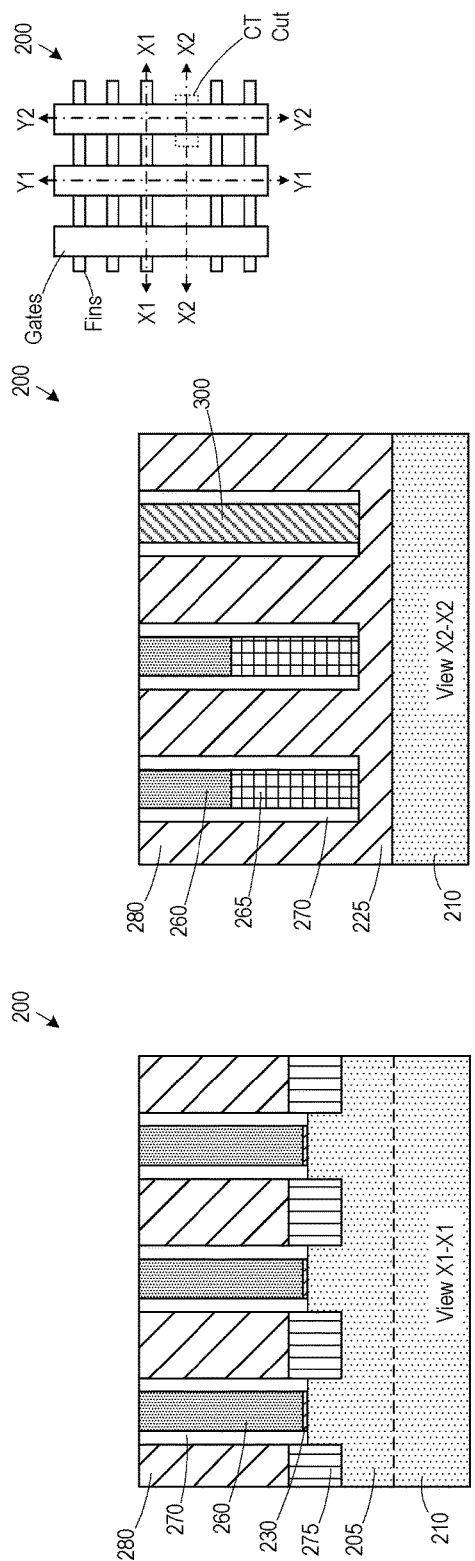
Figure 2J:
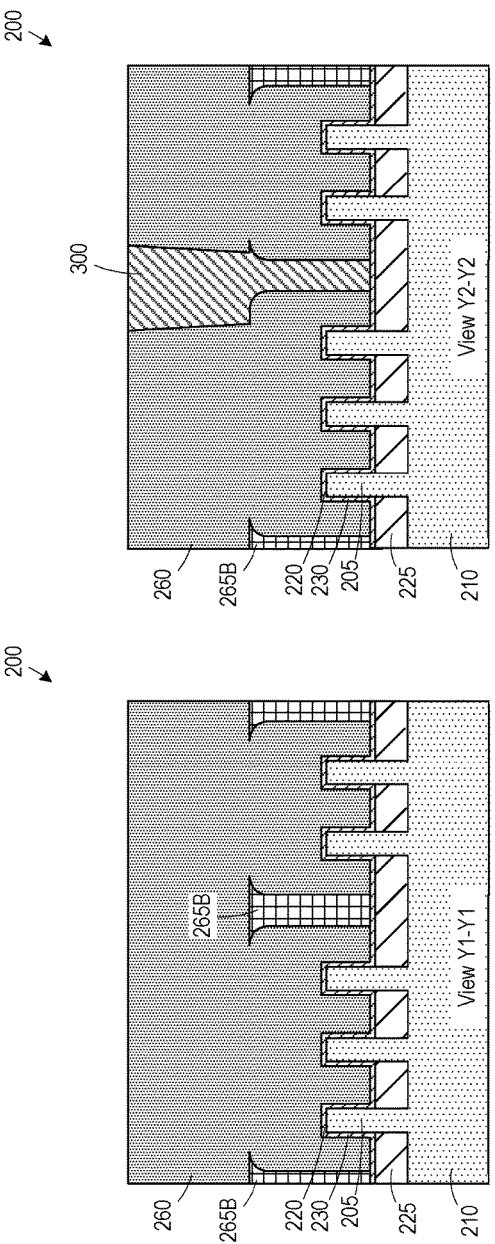

FIG. 2J illustrates the product 200 after a deposition process was performed to fill the gate cut cavity 295 with a dielectric material (e.g., SiN, SiC, SiCO, SiBCN, SiOCN, etc.) to define a gate cut structure 300 therein. A planarization process may be performed to remove portions of the dielectric material extending beyond the gate cut cavity 295. The planarization process may also remove remaining portions of the hard mask layer 255 to expose the placeholder gate electrodes 260.

Figure 2K:
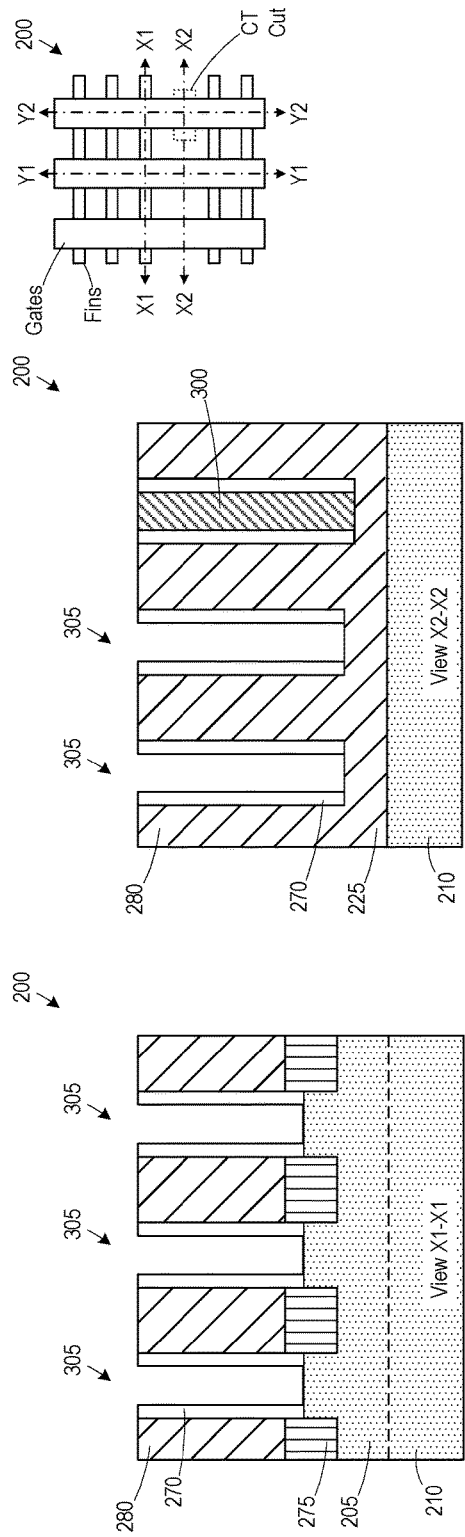
Figure 2K:
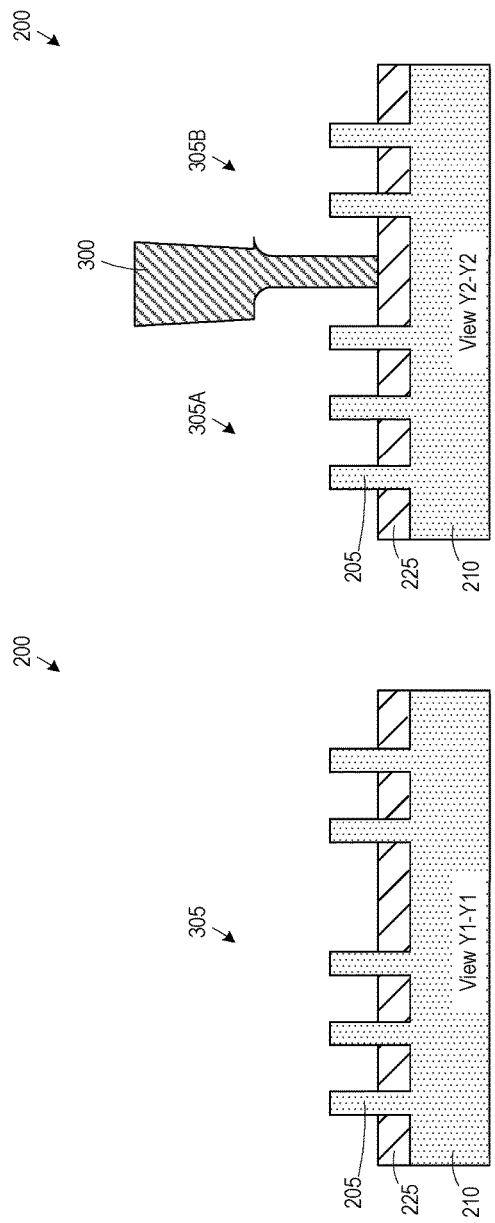

FIG. 2K illustrates the product 200 after one or more etch processes were performed. An etch process was performed to remove the placeholder gate electrodes 260 and the remaining sacrificial gate cut structures 265B. An etch chemistry may be selected that concurrently removes the materials of the placeholder gate electrodes 260 (e.g., a-SI) and the remaining sacrificial gate cut structures 265B (e.g., SiGe). Another etch process was performed to remove exposed portions of the second hard mask layer 220 and the liner layer 230, thereby exposing the fins 205 in the channel regions of the device and defining a plurality of gate cavities 305. Note that the gate cavity 305A, 305B in the CT cut region are segmented by the gate cut structure 300.

Figure 2L:
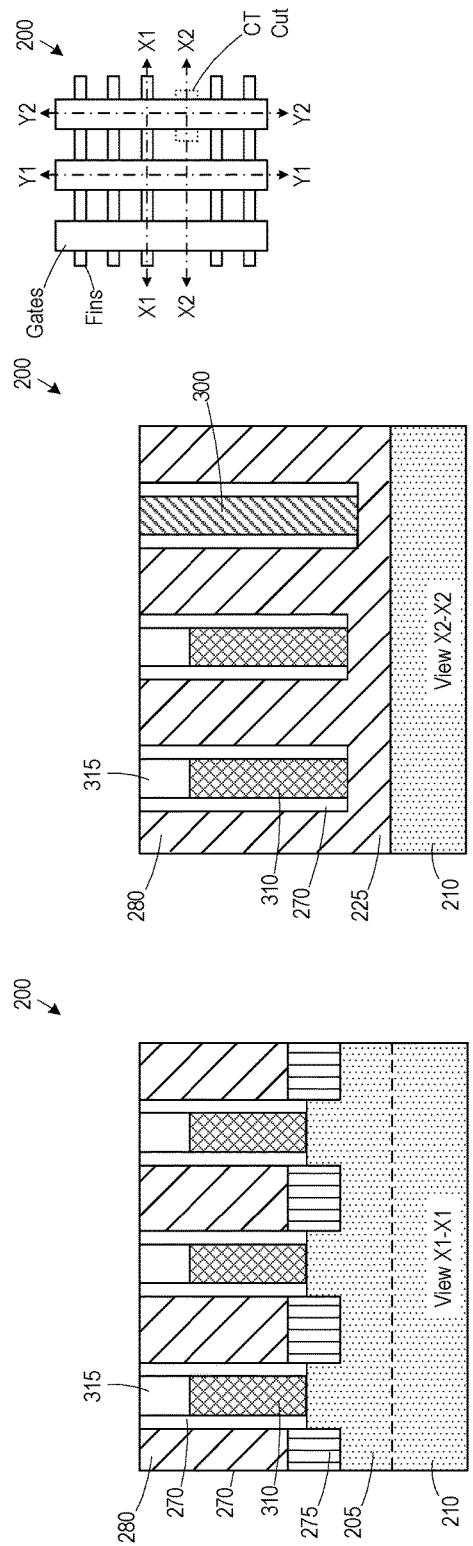
Figure 2L:
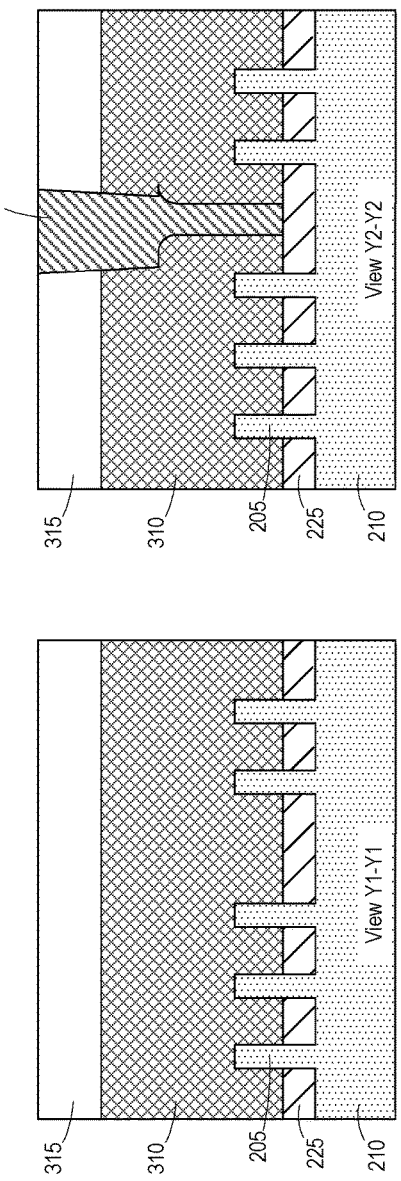

FIG. 2L illustrates the product 200 after a plurality of processes were performed. One or more deposition processes were performed to form one or more layers (not separately shown) for replacement gate structures 310 in the gate cavities 305, 305A, 305B (e.g., gate insulation layer, work function material layer, barrier layer, seed layer, fill layer, etc.). The replacement gate material may be planarized and recessed, and a cap layer 315 may be formed.

Additional process steps may be formed to complete fabrication of the product 200, such as the forming of source/drain contacts and various metallization layers including interconnects for contacting the various portions of the product, such as the source/drain regions, gate structures, etc. The process flow illustrated above has several advantages. Because the gate cut structure 300 is formed prior to forming the replacement gate structures 310 using a self-aligned process, the separation between the gate cut structure 310 and the fins 205 is better controlled, thereby increasing the process margin for forming the replacement gate structures 310.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a plurality of fins above a substrate;
    forming a first placeholder gate electrode above the plurality of fins, wherein the first placeholder gate electrode comprises a placeholder material;
    forming a first sacrificial gate cut structure of a sacrificial material different than the placeholder material embedded in the first placeholder gate electrode, wherein a portion of the placeholder material is positioned above the first sacrificial gate cut structure;
    removing the portion of the first placeholder gate electrode to expose the first sacrificial gate cut structure;
    removing the first sacrificial gate cut structure to define a gate cut cavity extending vertically through the first placeholder gate electrode;
    forming a dielectric material in the gate cut cavity to define a gate cut structure;
    removing the first placeholder gate electrode to define a first gate cavity segmented by the gate cut structure; and
    forming a first replacement gate structure in the first gate cavity.

2. The method of claim 1, wherein forming the first placeholder gate electrode comprises:
    forming a first hard mask layer above the substrate;
    etching the substrate using the first hard mask to form the plurality of fins;
    forming a first spacer adjacent a first subset of the plurality of fins and a second spacer adjacent a second subset of the plurality of fins, wherein the first and second spacers are formed of the placeholder material, and the first and second spacers cover sidewalls of the plurality of fins and sidewalls of the first hard mask layer; and
    forming a placeholder layer of the sacrificial material in a first cavity defined between the first and second spacers.

3. The method of claim 2, wherein forming the first placeholder gate electrode further comprises:
    removing the first hard mask layer to define a second cavity;
    forming a placeholder layer of the placeholder material in the second cavity and above the first and second spacers; and
    patterning the first and second spacers, the placeholder layer, and the sacrificial layer to define the first placeholder gate electrode from the first and second spacers and the first sacrificial layer, and to define the first sacrificial gate cut structure from the sacrificial layer.

4. The method of claim 2, wherein the first spacer fills cavities defined between adjacent fins in the first subset, and the second spacer fills cavities defined between adjacent fins in the second subset.

5. The method of claim 1, wherein the placeholder material and the sacrificial material comprise silicon.

6. The method of claim 1, wherein the placeholder material comprises amorphous silicon and the sacrificial material comprises silicon germanium.

7. The method of claim 1, further comprising:
    forming a second placeholder gate electrode above the plurality of fins, wherein the second placeholder gate electrode comprises the placeholder material;
    forming a second sacrificial gate cut structure of the sacrificial material embedded in the second placeholder gate electrode concurrently with the forming of the first sacrificial gate cut structure, wherein the second sacrificial gate cut structure is not removed when the first sacrificial gate cut structure is removed;
    removing the second placeholder gate electrode and the second sacrificial gate cut structure in a concurrent etch process to define a second gate cavity; and
    forming a second replacement gate structure in the second gate cavity.

8. The method of claim 7, wherein the placeholder material comprises amorphous silicon and the sacrificial material comprises silicon germanium.

9. The method of claim 1, further comprising forming a liner layer above the plurality of fins prior to forming the first placeholder gate electrode.

10. The method of claim 9, further comprising removing a portion of the liner layer exposed by the first gate cavity.

11. A method, comprising:
    forming a semiconductor device comprising a plurality of fins formed above a substrate with a first hard mask layer positioned on an upper surface of the plurality of fins, and an isolation structure positioned between the plurality of fins;
    forming a first spacer adjacent a first subset of the plurality of fins and a second spacer adjacent a second subset of the plurality of fins, wherein the first and second spacers are formed of a placeholder material and the first and second spacers cover sidewalls of the plurality of fins and sidewalls of the first hard mask layer;
    forming a sacrificial layer of a sacrificial material different than the placeholder material in a first cavity defined between the first and second spacers;
    removing the first hard mask layer to define a second cavity;
    forming a placeholder layer of the placeholder material in the second cavity and above the first and second spacers and the sacrificial layer;
    patterning the first and second spacers, the placeholder layer, and the sacrificial layer to define a first placeholder gate electrode from the first and second spacers and to define a first sacrificial gate cut structure from the sacrificial layer;
    forming a third cavity in the placeholder layer to expose the first sacrificial gate cut structure;
    removing the first sacrificial gate cut structure to define a gate cut cavity extending vertically through the first placeholder gate electrode to the isolation structure;
    forming a dielectric material in the gate cut cavity to define a gate cut structure;

removing the first placeholder gate electrode to define a first gate cavity segmented by the gate cut structure; and forming a first replacement gate structure in the first gate cavity.

12. The method of claim 11, further comprising:

forming a third spacer adjacent a third subset of the plurality of fins and a fourth spacer adjacent a fourth subset of the plurality of fins, wherein the third and fourth spacers are formed of the placeholder material and cover sidewalls of the first hard mask layer;

forming the sacrificial layer in a second cavity defined between the third and fourth spacers;

forming the placeholder layer above the third and fourth spacers;

patterning the third and fourth spacers, the placeholder layer, and the sacrificial layer to define a second placeholder gate electrode from the third and fourth spacers and the placeholder layer, and to define a second sacrificial gate cut structure from the sacrificial layer formed between the third and fourth spacers;

removing the second placeholder gate electrode and the second sacrificial gate cut structure in a concurrent etch process to define a second gate cavity; and forming a second replacement gate structure in the second gate cavity.

13. The method of claim 12, wherein the placeholder material and the sacrificial material comprise silicon.

14. The method of claim 11, wherein the first spacer fills cavities defined between adjacent fins in the first subset, and the second spacer fills cavities defined between adjacent fins in the second subset.

15. The method of claim 11, wherein the placeholder material and the sacrificial material comprise silicon.

16. The method of claim 15, wherein the placeholder material comprises amorphous silicon and the sacrificial material comprises silicon germanium.

17. The method of claim 11, further comprising forming a liner layer above the plurality of fins prior to forming the first and second spacers.

18. The method of claim 17, further comprising removing a portion of the liner layer exposed by the first gate cavity.

19. A method, comprising:

forming a plurality of fins above a substrate;

forming a plurality of placeholder gate electrodes above the plurality of fins, wherein the placeholder gate electrodes comprise a placeholder material;

forming a plurality of sacrificial gate cut structures of a sacrificial material different than the placeholder material embedded in the plurality of placeholder gate electrodes;

removing portions of the placeholder gate electrodes to expose selected sacrificial gate cut structures;

removing the selected sacrificial gate cut structures to define gate cut cavities extending vertically through the associated placeholder gate electrodes;

forming a dielectric material in the gate cut cavities to define gate cut structures;

removing the placeholder gate electrodes and remaining sacrificial gate cut structures using a concurrent etch process to define gate cavities, wherein a subset of the gate cavities are segmented by the gate cut structures; and forming replacement gate structures in the gate cavities.

20. The method of claim 19, wherein the placeholder material and the sacrificial material comprise silicon.

\* \* \* \* \*